(12) United States Patent
Shinohara (10) Patent No.: US 10,823,288 B2
(45) Date of Patent: Nov. 3, 2020

(54) SLIDING MEMBER AND PISTON RING

(71) Applicant: KABUSHIKI KAISHA RIKEN, Tokyo (JP)

(72) Inventor: Akio Shinohara, Kashiwazaki (JP)

( * ) Notice: Subject to any disclaimer, the term of this patent is extended or adjusted under 35 U.S.C. 154(b) by 0 days.

(21) Appl. No.: 16/497,804

(22) PCT Filed: Jan. 22, 2018

(86) PCT No.: PCT/JP2018/001768
§ 371 (c)(1),
(2) Date: Sep. 26, 2019

(87) PCT Pub. No.: WO2018/179708
PCT Pub. Date: Oct. 4, 2018

(65) Prior Publication Data
US 2020/0284345 A1     Sep. 10, 2020

(30) Foreign Application Priority Data

Mar. 31, 2017   (JP) ................... 2017-070929

(51) Int. Cl.
*F16J 9/26*    (2006.01)
*C23C 14/06*    (2006.01)

(52) U.S. Cl.
CPC ............. *F16J 9/26* (2013.01); *C23C 14/0605* (2013.01); *C23C 14/0611* (2013.01)

(58) Field of Classification Search
CPC . F16J 9/26; F16J 9/28; C23C 14/0605; C23C 14/0611; C23C 16/26; C23C 16/27; B23P 15/06; B23P 15/065; B23P 15/08
See application file for complete search history.

(56) References Cited

U.S. PATENT DOCUMENTS

| | | |
|---|---|---|
| 6,066,399 A | 5/2000 | Hirano et al. |
| 6,080,470 A | 6/2000 | Dorfman |
| 2006/0239895 A1 | 10/2006 | Hasebe et al. |
| 2007/0078067 A1 | 4/2007 | Nakagawa et al. |
| 2007/0141347 A1 | 6/2007 | Nakagawa et al. |
| 2009/0209942 A1 | 8/2009 | Nakatani et al. |
| 2010/0024873 A1 | 2/2010 | Mahrize |
| 2010/0211180 A1 | 8/2010 | Helmuth et al. |
| 2011/0203082 A1 | 8/2011 | Kumamoto |

(Continued)

FOREIGN PATENT DOCUMENTS

| | | |
|---|---|---|
| CN | 1944992 | 4/2007 |
| CN | 101443054 | 5/2009 |

(Continued)

OTHER PUBLICATIONS

International Search Report dated Mar. 27, 2018 for PCT/JP2018/001768.

(Continued)

*Primary Examiner* — Jacob M Amick
(74) *Attorney, Agent, or Firm* — Soei Patent & Law Firm (57) ABSTRACT

A sliding member includes a base material and an amorphous hard carbon film formed on a surface of the base material, and the amorphous hard carbon film has a graded structure in which a $sp^2$ ratio increases from an inner surface side corresponding to the base material side toward an outer surface side. A piston ring includes the sliding member.

20 Claims, 7 Drawing Sheets

(56) References Cited

U.S. PATENT DOCUMENTS

| | | | |
|---|---|---|---|
| 2011/0268946 A1 | 11/2011 | Fischer et al. | |
| 2012/0068418 A1 | 3/2012 | Hoppe et al. | |
| 2012/0205875 A1* | 8/2012 | Kennedy | C23C 16/30 |
| | | | 277/442 |
| 2015/0292622 A1* | 10/2015 | Kennedy | F16J 9/28 |
| | | | 277/442 |
| 2015/0300493 A1* | 10/2015 | Kunimoto | F16J 9/26 |
| | | | 123/193.2 |
| 2016/0003356 A1 | 1/2016 | Ozaki et al. | |
| 2016/0245407 A1 | 8/2016 | Honda et al. | |
| 2017/0002454 A1 | 1/2017 | Ozaki et al. | |
| 2017/0175622 A1* | 6/2017 | Avelar Araujo | F16J 9/26 |
| 2017/0283935 A1 | 10/2017 | Moriguchi et al. | |
| 2018/0238450 A1 | 8/2018 | Ooshiro et al. | |
| 2018/0371608 A1 | 12/2018 | Moriguchi et al. | |
| 2020/0217416 A1 | 7/2020 | Okazaki et al. | |

FOREIGN PATENT DOCUMENTS

| | | |
|---|---|---|
| CN | 101627457 | 1/2010 |
| CN | 102171383 | 8/2011 |
| CN | 102428206 | 4/2012 |
| CN | 104630708 | 5/2015 |
| CN | 104903631 | 9/2015 |
| CN | 105593503 | 5/2016 |
| JP | H11-100294 | 4/1999 |
| JP | 2003-310744 | 11/2003 |
| JP | 2007-056721 | 3/2007 |
| JP | 2007-162099 | 6/2007 |
| JP | 2008-081630 | 4/2008 |
| JP | 2009-040927 | 2/2009 |
| JP | 2009-052067 | 3/2009 |
| JP | 2010-111935 | 5/2010 |
| JP | 2011-173164 | 9/2011 |
| JP | 2014-224239 | 12/2014 |
| WO | 2015/115601 | 8/2015 |
| WO | 2016/042630 | 3/2016 |
| WO | 2017/104822 | 6/2017 |

OTHER PUBLICATIONS

International Preliminary Report on Patentability with Written Opinion dated Oct. 10, 2019 for PCT/JP2018/001768.

International Preliminary Report on Patentability with Written Opinion dated Oct. 10, 2019 for PCT/JP2018/001769.

SOEI Patent and Law Firm, Statement of Related Matters, dated Jan. 9, 2020.

* cited by examiner

Fig.7

SLIDING MEMBER AND PISTON RING

CROSS-REFERENCE TO RELATED APPLICATIONS

This application is a 35 U.S.C. § 371 national phase application of PCT/JP2018/001768, filed on Jan. 22, 2018, which claims priority to Japanese Patent Application No. 2017-70929, filed on Mar. 31, 2017.

TECHNICAL FIELD

The present disclosure relates to a sliding member whose sliding surface is coated with an amorphous hard carbon film and particularly to one used in vehicle parts or mechanical parts. As an example, a piston ring is exemplified.

BACKGROUND

Automobile engines are required to improve fuel efficiency. For example, in order to reduce friction loss, piston rings whose sliding surfaces are coated with an amorphous hard carbon film having a low friction coefficient are applied to some engines. The amorphous hard carbon film is also referred to as a diamond like carbon (DLC) film (or simply a hard carbon film). The amorphous hard carbon film is a mixture of diamond bond ($sp^3$ bond) and graphite bond ($sp^2$ bond) as a carbon bond. The amorphous hard carbon film is suitable as a protective film of the sliding member because it has hardness, wear resistance, and chemical stability similar to those of diamond as well as solid lubricity and a low friction coefficient similar to those of graphite.

Patent Literature 1 relates to a piston ring which includes a hard carbon film formed on at least an outer peripheral sliding surface of a piston ring base material. This hard carbon film has a feature that a $sp^2$ component ratio is in the range of 40% to 80%, a hydrogen content is in the range of 0.1 atomic % to 5 atomic %, and the amount of macroparticles appearing on a surface is in the range of 0.1% to 10% in proportion to the area. According to Patent Literature 1, the piston ring with the above-described configuration readily forms a film and wear resistance is excellent. Additionally, the "$sp^2$ component ratio" of Patent Literature 1 indicates a component ratio ($sp^2/(sp^2+sp^3)$) of a graphite component ($sp^2$) with respect to a graphite component ($sp^2$) and a diamond component ($sp^3$) of the hard carbon film and is measured by TEM-EELS spectrum obtained by combining a transmission electron microscope (TEM) with electron energy loss spectroscopy (EELS) (see Paragraphs [0054] to [0056] of Patent Literature 1).

CITATION LIST

Patent Literature

Patent Literature 1: WO2015/115601

SUMMARY

Technical Problem

As an initial matter, the amorphous hard carbon film substantially without hydrogen (for example, the film having a hydrogen content smaller than 5 atomic %) can be formed to have a film thickness of about 30 μm by adjusting a film forming condition. However, a film having a high $sp^3$ ratio has large residual stress when forming the film. When a thick film is formed, the adhesion with the base material becomes insufficient and hence the film is readily peeled off therefrom. Meanwhile, a relatively soft film having a low $sp^3$ ratio has a problem that the film is readily peeled off due to plastic deformation of the base material or the wear due to sliding under a high surface pressure.

There is a room for improvement in that the hard carbon film is readily peeled off from the base material (the piston ring base material) even when the $sp^2$ component ratio of the hard carbon film is in the range of 40 to 80% as in the piston ring described in Patent Literature 1. That is, when a film (a relatively hard film) having a relatively low $sp^2$ component ratio is formed thick, the adhesion with the base material is not sufficient. Meanwhile, in a film (a relatively soft film) having a relatively high $sp^2$ component ratio, the peeling due to the plastic deformation of the base material or the wear due to the sliding under a high surface pressure is not sufficiently prevented. Particularly, when a high thermal conductive material without a thermosetting treatment or surface modification is applied to the base material in order to efficiently release heat inside a combustion chamber to a cylinder wall surface, the surface pressure at the time of sliding tends to cause chipping or peeling of the film due to the deformation of the interface with the base material.

According to the examination of the inventors, the amorphous hard carbon film has the following two essential properties and the low adhesion to the base material is a major obstacle to a practical use due to these properties.

(1) The large residual stress exists due to the film formation.

(2) The carbon bond is chemically stable.

An object of the disclosure is to provide a sliding member and a piston ring capable of sufficiently suppressing an amorphous hard carbon film from being peeled off from a base material and having sufficiently high wear resistance.

Solution to Problem

The inventors have carried out a careful examination in order to solve the above-described problems and have found that a sliding member with an amorphous hard carbon film having excellent wear resistance and preventing chipping or peeling of a film due to an excellent adhesion with a base material can be obtained by a graded structure in which a $sp^2$ ratio increases continuously or stepwisely in a film thickness direction of the amorphous hard carbon film formed on a sliding surface of the sliding member. As a result, the following invention is completed.

A sliding member of the disclosure includes a base material, and an amorphous hard carbon film formed on a surface of the base material, in which the amorphous hard carbon film has a graded structure in which a $sp^2$ ratio increases from an inner surface side corresponding to the base material side toward an outer surface side. According to the examination of the inventors, such a graded structure is useful for achieving both excellent peel resistance and wear resistance at a sufficiently high level. That is, a relatively low $sp^2$ ratio of the base material side in the amorphous hard carbon film (hereinafter, referred to as a "film") of the sliding member means that the amorphous hard carbon film in the vicinity of the base material has relatively high strength. Accordingly, it is possible to prevent the peeling of the film due to the breakage of the film caused by the load applied to the film in the vicinity of the interface with the base material at the time of sliding in a high load state. Further, even when the soft base material is used, it is possible to suppress the deformation of the base material and to prevent the peeling of the film caused by the deformation. That is, it is possible to secure a sufficient adhesion with the base material. Meanwhile, a case in which the $sp^2$ ratio of the outer surface side is relatively high means that the bond strength of carbon atoms is relatively weak, that is, the film is flexible. For example, when foreign substances such as wear powder and dust generated by sliding pass through the sliding surface, the surface of the film serves as a cushion and hence the peeling due to a crack in the film can be prevented. When the $sp^2$ ratio of the entire film is high, the strength of the film decreases. Meanwhile, when the $sp^2$ ratio has a gradation between the inner surface side and the outer surface side, the adhesion can be secured while maintaining the film strength (the wear resistance).

In particular, in the case of the application to a part such as a piston ring having a curved sliding surface, the contact area with an adjacent member is narrow in an initial sliding state in which the film is not worn out. Additionally, since there is a risk that a crack is generated due to a high local surface pressure when foreign substances leak, the $sp^2$ ratio may be high on the surface layer side. Additionally, since the surface pressure gradually decreases as the film wears out with use, the $sp^2$ ratio may decrease toward the inner surface side in relation to the outer surface side. That is, as the film wears out with the use of the piston ring, an area (a relatively hard area) having a low $sp^2$ ratio is exposed to the surface due to the graded structure of the film. In a state in which the relatively hard area is exposed, since the surface pressure of the piston ring is normally lower than the initial state, the crack due to, for example, the locally high surface pressure tends to rarely occur.

In the disclosure, the "$sp^2$ ratio" indicates a ratio ($sp^2/(sp^2+sp^3)$) of $sp^2$ bond with respect to $sp^2$ bond and $sp^3$ bond of the amorphous hard carbon film and means a value calculated on the basis of spectrum obtained by electron energy loss spectroscopy (EELS).

Additionally, the $sp^2$ ratio in the thickness direction of the amorphous hard carbon film may increase continuously or stepwisely or a combination thereof may be used. Further, a basic condition of the invention is a condition related to the amorphous hard carbon film. When such a condition is satisfied, the amorphous hard carbon film having excellent peel resistance and wear resistance can be obtained. Thus, a configuration in which a wear resistant surface treatment layer is further formed on the outer surface side of the amorphous hard carbon film and a base film is formed on the inner surface side thereof does not deviate from the scope of the invention. Further, a configuration in which an intermediate layer formed of a specific metal or its carbide or nitride is formed between the base material and the amorphous hard carbon film does not deviate from the scope of the invention.

When the $sp^2$ ratio of the inner surface side of the amorphous hard carbon film is indicated by A % and the $sp^2$ ratio of the outer surface side of the amorphous hard carbon film is indicated by B %, a value of (B−A) may be 20 or more. Further, the $sp^2$ ratio (A %) of the inner surface side of the amorphous hard carbon film may be smaller than 40% and the $sp^2$ ratio (B %) of the outer surface side of the amorphous hard carbon film may be larger than 65%. From the viewpoint of achieving a friction coefficient in which the hydrogen content of the amorphous hard carbon film is low, a value smaller than 5 atomic % can be used. A thickness of the amorphous hard carbon film is, for example, 3 μm to 40 μm.

A density of droplets of 300 μm$^2$ or more in size existing on the surface of the amorphous hard carbon film may be 600 pieces/mm$^2$ or less. The droplet is a concave portion or a convex portion formed on the surface of the amorphous hard carbon film due to the incorporation of droplet particles or the separation of particles.

As a material forming the base material, for example, a steel material having a thermal conductivity of 30 W/(m·K) or more can be employed from the viewpoint of achieving excellent thermal conductivity of the sliding member. In recent years, downsizing of the engine has been promoted in order to achieve further improvement in fuel efficiency and performance from the viewpoint of environmental protection and, for example, a system in which a direct injection engine is combined with a turbocharger has been developed. As a result, since the engine temperature rises, sliding members such as piston rings are required to fully function in a very severe environment such as high temperature and a high surface pressure. Further, an increase in engine temperature tends to cause knocking leading to a decrease in engine output. In order to suppress this knocking, the piston ring is required to have excellent wear resistance and high thermal conductivity capable of efficiently releasing heat in the combustion chamber from the piston to the cylinder wall surface through the piston ring.

The disclosure provides a piston ring which includes the sliding member. Since the amorphous hard carbon film has the graded structure, this piston ring can sufficiently suppress the amorphous hard carbon film from being peeled off from the base material and have sufficiently high wear resistance.

Advantageous Effects of Invention

According to the disclosure, a sliding member and a piston ring capable of sufficiently suppressing an amorphous hard carbon film from being peeled off from a base material and having sufficiently high wear resistance are provided.

DETAILED DESCRIPTION

Hereinafter, embodiments of the disclosure will be described with reference to the drawings. The invention is not limited to the following embodiments.

<Sliding Member>

Figure 1:
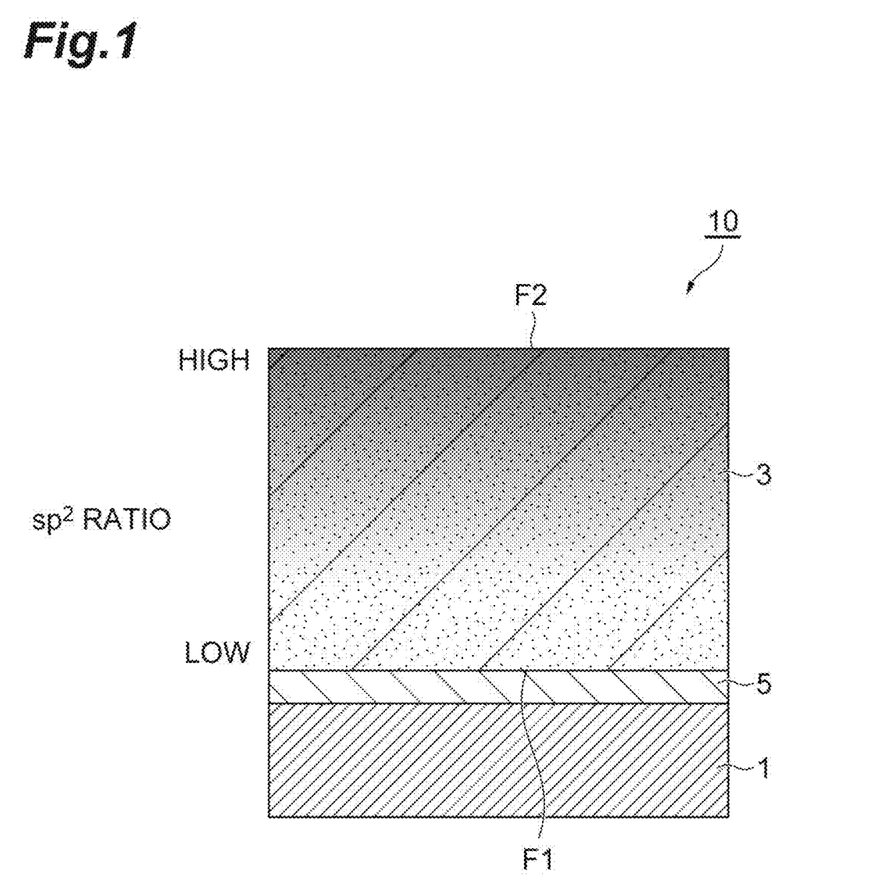
FIG. 1 is a cross-sectional view schematically illustrating an embodiment of a sliding member according to the disclosure.

FIG. 1 is a cross-sectional view schematically illustrating a structure of a sliding member according to an embodiment. As illustrated in the drawing, a sliding member 10 includes a base material 1, an amorphous hard carbon film 3 which is formed on a surface of the base material 1, and an intermediate layer 5 which is formed between the base material 1 and the amorphous hard carbon film 3. That is, the sliding member 10 is manufactured by forming the amorphous hard carbon film 3 on the surface of the base material 1 with the intermediate layer 5 interposed therebetween.

(Amorphous Hard Carbon Film)

In a cross-section of the amorphous hard carbon film 3 illustrated in FIG. 1, the shading indicates a $sp^2$ ratio. Specifically, a portion with a low $sp^2$ ratio is indicated by a light color and a portion with a high $sp^2$ ratio is indicated by a dark color. That is, the amorphous hard carbon film 3 has a graded structure in which the $sp^2$ ratio increases from a side of an inner surface F1 corresponding to a side of the base material 1 toward a side of an outer surface F2.

Figure 2:
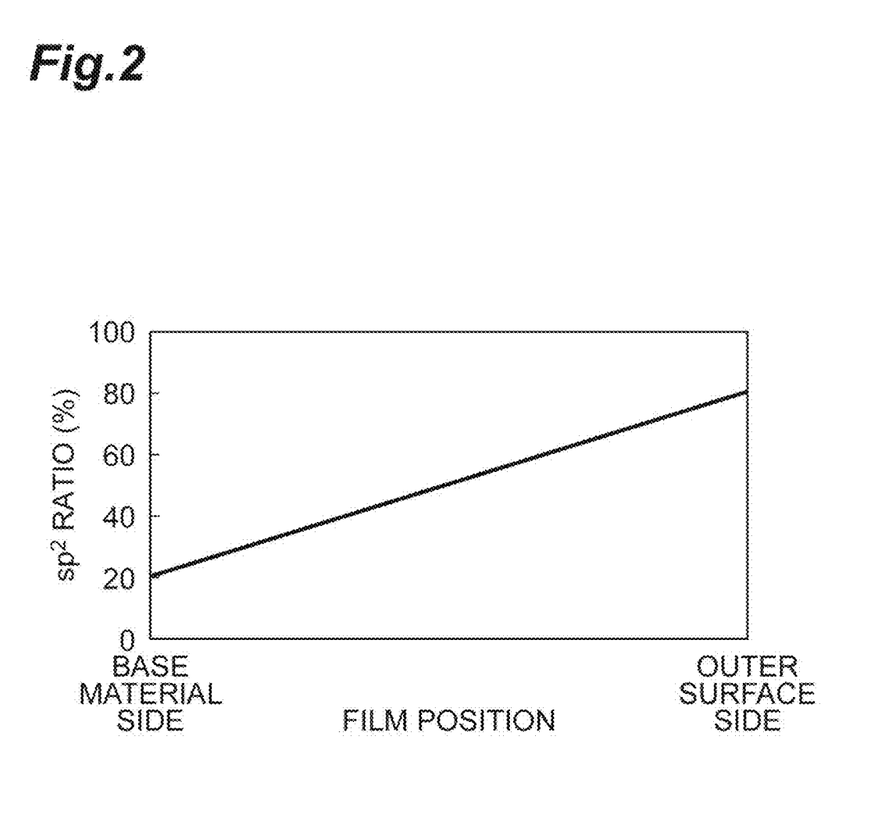
FIG. 2 is a graph showing an example of a $sp^2$ ratio profile of an amorphous hard carbon film.
Figure 3:
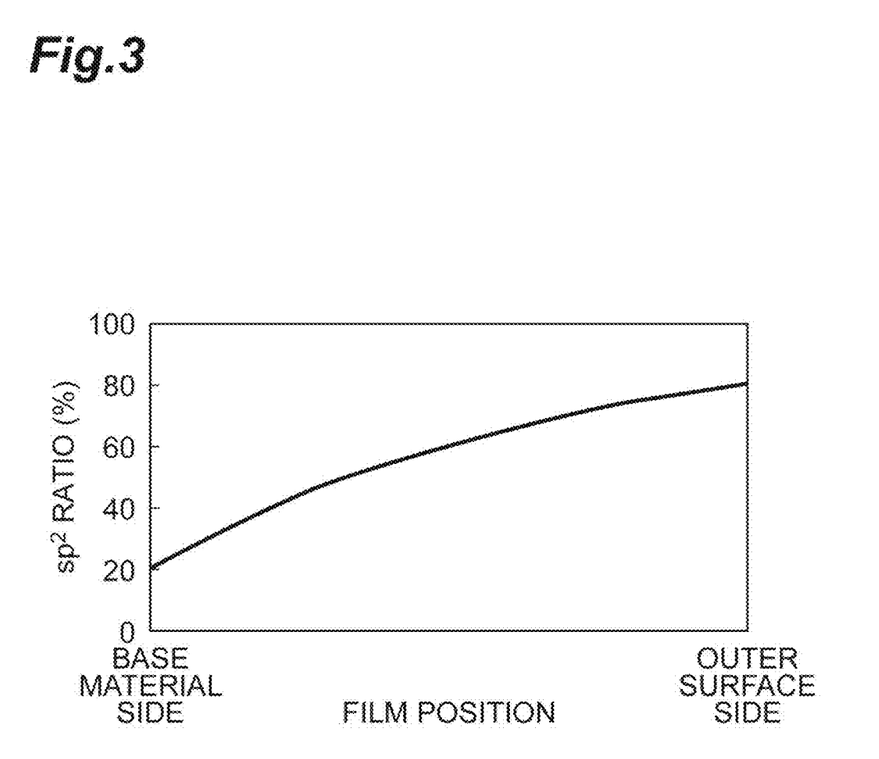
FIG. 3 is a graph showing another example of the $sp^2$ ratio profile of the amorphous hard carbon film.
Figure 4:
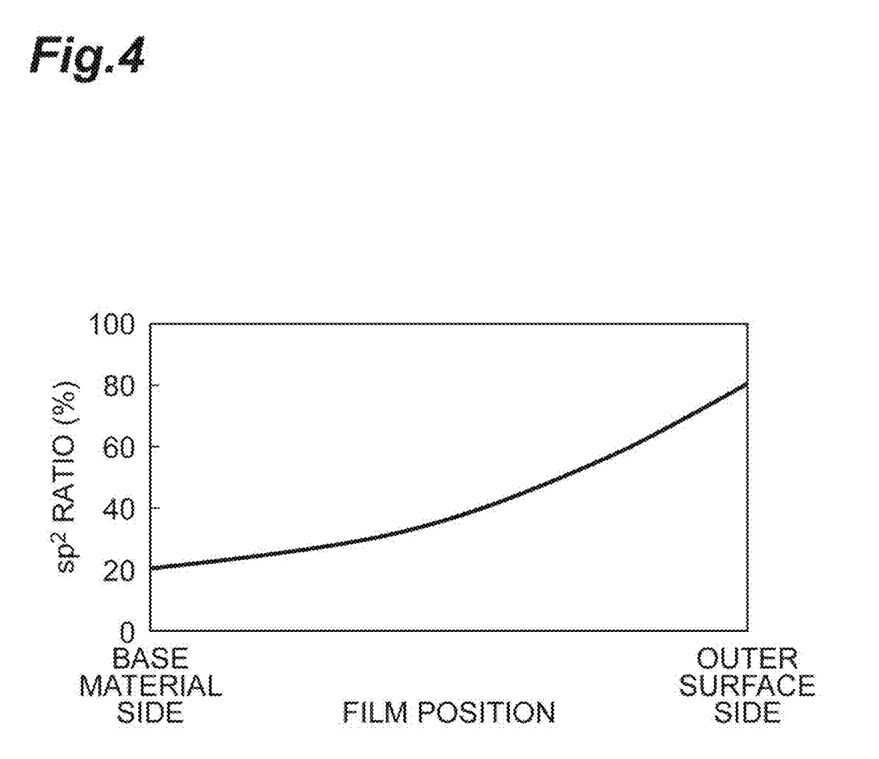
FIG. 4 is a graph showing another example of the $sp^2$ ratio profile of the amorphous hard carbon film.
Figure 5:
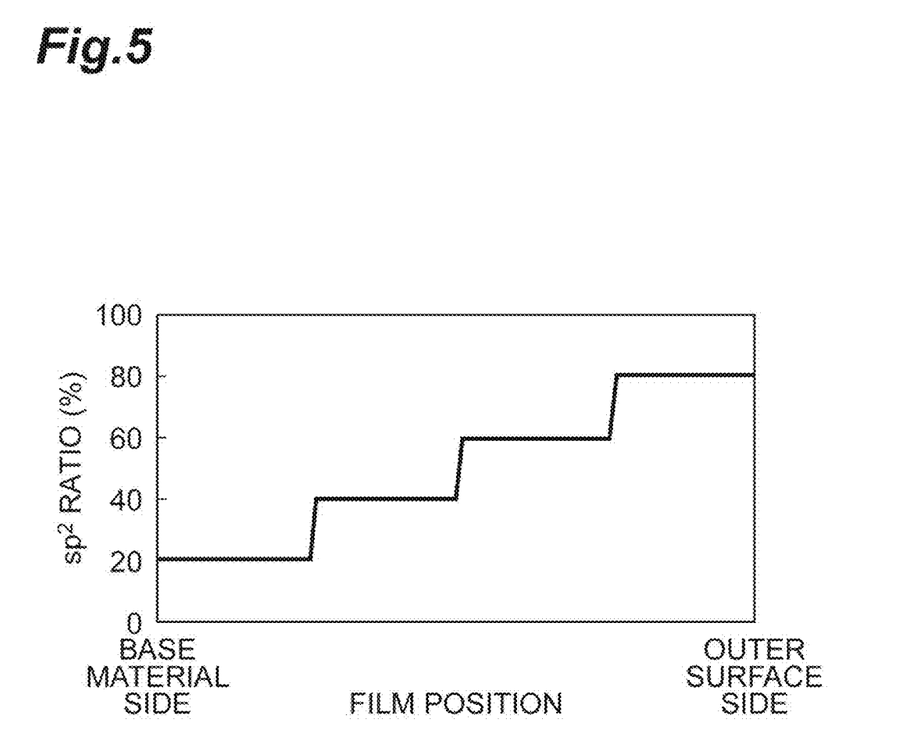
FIG. 5 is a graph showing another example of the $sp^2$ ratio profile of the amorphous hard carbon film.

In the amorphous hard carbon film 3, the $sp^2$ ratio may increase continuously or stepwisely. FIGS. 2 to 5 are graphs respectively showing an example of the $sp^2$ ratio profile of the amorphous hard carbon film 3, in which a horizontal axis indicates a film position (a left side is the base material side and a right side is the outer surface side) and a vertical axis indicates a value of the $sp^2$ ratio. FIGS. 2 to 4 show a case in which the $sp^2$ ratio of the amorphous hard carbon film 3 increases continuously from the inner surface F1 (the side of the base material 1) toward the outer surface F2. FIG. 2 shows a linear increase case, FIG. 3 shows a case in which an increasing curve has an upward convex shape, and FIG. 4 shows a case in which an increasing curve has a downward convex shape. FIG. 5 shows a case in which the $sp^2$ ratio increases stepwisely from the inner surface F1 (the side of the base material 1) toward the outer surface F2 in the amorphous hard carbon film 3. Additionally, here, a case in which the $sp^2$ ratio increases continuously or stepwisely has been exemplified, but a combination shape thereof may be used.

In the amorphous hard carbon film 3, an area on the side of the inner surface F1 is formed of amorphous hard carbon having a low $sp^2$ ratio (a high $sp^3$ ratio) and a relatively small deformability. An area having a low $sp^2$ ratio existing on the side of the inner surface F1 serves as a base film. That is, even when a material not subjected to a thermosetting treatment or surface modification for securing adhesion on its surface or a material having a relatively high thermal conductivity (for example, 30 W/(m·K) or more) is used as the base material 1, an area having a low $sp^2$ ratio suppresses the deformation of the interface and prevents the chipping or peeling of the amorphous hard carbon film 3. Additionally, the amorphous hard carbon having a low $sp^2$ ratio (a high $sp^3$ ratio) has a high thermal conductivity as compared with the amorphous hard carbon having a high $sp^2$ ratio (a low $sp^3$ ratio).

In the amorphous hard carbon film 3, an area on the side of the outer surface F2 is formed of amorphous hard carbon having a high $sp^2$ ratio (a low $sp^3$ ratio) and relative deformability. An area existing on the side of the outer surface F2 and having a high $sp^2$ ratio means that the bond strength of carbon atoms is relatively weak, that is, the film is relatively deformable. For example, when foreign substances such as wear powder and dust generated by sliding pass through the sliding surface, the surface of the film serves as a cushion and hence the peeling due to the cracking of the film can be prevented. Particularly, in the case of the application to a part such as a piston ring having a curved sliding surface, the contact area with an adjacent member is narrow in an initial sliding state in which the film is not worn out. Additionally, since there is a risk that a crack is generated due to a locally high surface pressure when foreign substances leak, the $sp^2$ ratio may be high on the surface layer side. Additionally, since the surface pressure gradually decreases as the film wears out with use, the $sp^2$ ratio may decrease toward the inner surface side in relation to the outer surface side. For the $sp^2$ ratio, the strength of the film is low when the $sp^2$ ratio of the entire film is high. However, when there is a gradation between the inner surface side and the outer surface side, it is possible to secure the adhesion while maintaining the film strength (the wear resistance). Further, since the outer surface F2 is formed of a material having a high $sp^2$ ratio, there is an advantage that a finishing process is facilitated.

When the $sp^2$ ratio on the side of the inner surface F1 of the amorphous hard carbon film 3 is indicated by A % and the $sp^2$ ratio on the side of the outer surface F2 of the amorphous hard carbon film 3 is indicated by B %, a value of (B−A) is preferably 20 or more, more preferably 20 to 60, and further preferably 40 to 60. Since the value of (B−A) is 20 or more, it is easy to sufficiently secure the adhesion of the amorphous hard carbon film 3 with respect to the base material 1. Accordingly, it is possible to highly suppress the chipping or peeling of the amorphous hard carbon film 3 and to readily achieve excellent wear resistance of the amorphous hard carbon film 3. Meanwhile, there is an advantage that the amorphous hard carbon film 3 of which the value of (B−A) is 60 or less can be readily formed, the film does not become excessively inhomogeneous, and minute chipping or peeling rarely occurs.

The $sp^2$ ratio (A %) on the side of the inner surface F1 of the amorphous hard carbon film 3 is preferably smaller than 40%, more preferably 10 to 35%, and further preferably 15 to 30%. Since the $sp^2$ ratio (A %) on the side of the inner surface F1 is smaller than 40%, it is easy to sufficiently secure the adhesion of the amorphous hard carbon film 3 with respect to the base material 1, for example, even when a thermosetting treatment or surface modification for securing the adhesion is not performed on the surface of the base material 1. Meanwhile, there is an advantage that the amorphous hard carbon film 3 of which the $sp^2$ ratio (A %) on the side of the inner surface F1 is 10% or more can be readily formed and chipping rarely occurs.

The $sp^2$ ratio (B %) on the side of the outer surface F2 of the amorphous hard carbon film 3 is preferably larger than 65%, more preferably 65% to 80%, and further preferably 70 to 75%. Since the $sp^2$ ratio (B %) on the side of the outer surface F2 is larger than 65%, the initial conformability with an adjacent member is excellent, the chipping or peeling of the amorphous hard carbon film 3 can be highly suppressed, and the excellent wear resistance of the amorphous hard carbon film 3 can be readily achieved. In addition, there is an advantage that the finishing processability of the amorphous hard carbon film 3 is excellent. Meanwhile, there is an advantage that the amorphous hard carbon film 3 of which the $sp^2$ ratio (B %) on the side of the outer surface F2 is 80% or less can be readily formed, an excessive decrease in strength does not occur, and durability can be secured.

The thickness of the amorphous hard carbon film 3 is, for example, in the range of 3 to 40 μm. The wear rarely occurs when the thickness of the amorphous hard carbon film 3 is 3 μm or more. Meanwhile, when the thickness of the amorphous hard carbon film 3 is 40 μm or less, an excessive increase in internal stress of the film can be suppressed and the occurrence of the chipping or peeling can be readily suppressed. From the viewpoint of the productivity or durability of the sliding member 10, the thickness of the amorphous hard carbon film 3 is preferably 3 to 20 μm and more preferably 5 to 12 μm. Additionally, since the amorphous hard carbon film 3 has the graded structure of the $sp^2$ ratio, it is possible to sufficiently secure the adhesion with the base material 1 even when the amorphous hard carbon film 3 is relatively thick. The lower limit value of the thickness of the amorphous hard carbon film 3 may be 8 µm or 10 µm and may be 16 µm or 22 µm, for example, when excellent durability is required.

It is preferable that the amorphous hard carbon film 3 does not substantially include hydrogen from the viewpoint of achieving the low friction coefficient. Specifically, the hydrogen content of the amorphous hard carbon film 3 is preferably smaller than 5 atomic %, more preferably smaller than 3 atomic %, further preferably smaller than 2 atomic %, and particularly preferably smaller than 1 atomic %. When the amorphous hard carbon film 3 does not substantially include hydrogen, dangling bonds of surface carbon atoms of the amorphous hard carbon film 3 are not terminated by hydrogen. For this reason, since an oil agent constituent molecule having an OH group in the lubricant is readily adsorbed to the surface of the amorphous hard carbon film 3, it is observed that a very low friction coefficient is exhibited. Further, the amorphous hard carbon which substantially does not include hydrogen has excellent thermal conductivity. The hydrogen content of the amorphous hard carbon film 3 can be measured by Rutherford Backscattering Spectrometry (RBS) and Hydrogen Forward Scattering (HFS).

It is preferable that the density of the relatively large droplets (for example, a size of 300 µm$^2$ or more) existing on the surface of the amorphous hard carbon film 3 be 600 pieces/mm$^2$ or less. Since the density is set to 600 pieces/mm$^2$ or less, the initial conformability with an adjacent member is excellent, the chipping of the amorphous hard carbon film 3 or the peeling of the surface layer can be suppressed, and the wear resistance is excellent. The density of droplets is more preferably 300 pieces/mm$^2$ or less. The density of droplets can be calculated by visually counting the number of the concave portions or the convex portions having a size of 300 µm$^2$ or more due to the incorporation of droplet particles or the separation of particles existing within a predetermined range of the surface by using a microscope. Of course, this may be counted by using an image process or the like.

(Base Material)

As the base material 1, a suitable material may be employed in response to the application of the sliding member 10. When the sliding member 10 is required to have high thermal conductivity, for example, the piston ring having a configuration illustrated in FIG. 1 is manufactured, it is preferable to employ a material (for example, a steel material) having a thermal conductivity of 30 W/(m·K) or more as the base material 1. The thermal conductivity of the base material 1 is more preferably 35 W/(m·K) or more and further preferably 38 W/(m·K) or more. The piston ring has an important function of transmitting the heat received by the piston top portion to the cooled cylinder wall in addition to a gas sealing function of maintaining the air-tightness between the piston and the cylinder wall and an oil control function of maintaining an appropriate lubricant film on the cylinder wall.

In general, the thermal conductivity of the steel material becomes higher as the content of the alloy component becomes smaller. In contrast, since the high temperature characteristics are inferior, the material cannot be used as a sliding member of an automobile engine in a high heat load environment. However, for example, it is possible to achieve both of thermal conductivity and high temperature characteristics by performing system control of improving high temperature characteristics by reinforcing particle dispersion of spheroidized cementite, or the like. As such a steel material, material symbols SUP9, SUP10, and the like defined in HS G4801 can be exemplified.

(Intermediate Layer)

The intermediate layer 5 is used to further improve the adhesion between the base material 1 and the amorphous hard carbon film 3. The intermediate layer 5 is preferably formed of a component which has lattice matching with the metal of the base material 1 and which is more likely to form carbon and carbide of the amorphous hard carbon film 3 as compared with the metal of the base material 1. Specifically, the intermediate layer 5 is preferably formed of at least one metal selected from a group consisting of Ti, Cr, Si, Co, V, Mo, and W or its metal carbide. Further, when the sliding member 10 is used in a severe environment such as high surface pressure, the intermediate layer 5 is preferably formed of a nitride of at least one metal selected from the group consisting of Ti, Zr, Cr, Si, and V. In this case, even when the amorphous hard carbon film 3 is worn away, the sliding property can be maintained by the presence of the intermediate layer 5.

It is preferable that the thickness of the intermediate layer 5 be thin to a degree that the deformation of the intermediate layer 5 does not influence the adhesion of the amorphous hard carbon film 3. Specifically, the thickness of the intermediate layer 5 is preferably 0.01 to 0.4 µm, more preferably 0.03 to 0.3 µm, and further preferably 0.05 to 0.2 µm.

When sufficient adhesion can be secured even when the amorphous hard carbon film 3 is directly formed on the surface of the base material 1, the intermediate layer 5 may not be provided. For example, when the amorphous hard carbon film 3 substantially does not include hydrogen, it is easy to secure sufficient adhesion even when the intermediate layer 5 is not provided if scale, oil, or the like does not adhere to the base material 1. For the excellent adhesion, it is preferable to clean the surface of the base material 1 before the formation of the amorphous hard carbon film 3. For example, it is preferable to remove the oxide film on the surface of the base material 1 by a mechanical pre-processing and to clean the surface by a hydrocarbon type cleaning agent.

<Method of Forming Amorphous Hard Carbon Film>

The amorphous hard carbon film 3 can be formed by using, for example, an arc ion plating device equipped with a graphite cathode as an evaporation source. According to this device, the amorphous hard carbon film 3 is formed in such a manner that a vacuum arc discharge is generated between a graphite cathode and an anode in a vacuum atmosphere to evaporate and ionize a carbon material from a surface of a carbon cathode and carbon ions are deposited on a sliding surface of a base material (the sliding member to be provided with an amorphous hard carbon film) to which a negative bias voltage is applied.

The distribution of the sp$^2$ ratio of the amorphous hard carbon film 3 can be adjusted according to, for example, the following method. That is, it is possible to obtain a target sp$^2$ ratio distribution (a graded structure) by appropriately adjusting the bias voltage applied to the sliding member during the formation of the film in the arc ion plating device.

In order to form the amorphous hard carbon film 3 which substantially does not include hydrogen, the film may be formed without introducing a carbon-based gas. Additionally, hydrogen may be included at less than 5 atomic % due to the moisture remaining on the wall surface in the device. Since the droplets characteristically formed in the arc ion plating are incorporated into the amorphous hard carbon film 3 to reduce the film strength, a filtered arc system equipped with a magnetic filter for removing the droplets may be used.

In this case, it is possible to form the amorphous hard carbon film 3 which is very homogeneous and has excellent wear resistance with fewer droplets.

As described above, the embodiments of the disclosure have been described in detail, but the invention is not limited to the above-described embodiments. For example, in an above-described embodiment, the sliding member 10 including the intermediate layer 5 formed between the base material 1 and the amorphous hard carbon film 3 if necessary has been exemplified. However, for example, a wear resistant surface treatment layer may be further formed on the outer surface side of the amorphous hard carbon film 3 or a base film may be formed on the inner surface side thereof.

EXAMPLES

Hereinafter, Examples and Comparative Examples of the disclosure will be described. The invention is not limited to the following examples.

Example 1

A piston ring was manufactured as below by using an arc ion plating device. First, a pre-cleaned piston ring base material (SUP10 equivalent material) was set in a jig. An arc ion plating device with a graphite cathode and a Cr cathode was prepared in an evaporation source. After the above-described jig was attached to a rotation shaft of a rotation table of this device, the inside of a chamber of the device was set to a vacuum atmosphere of $1 \times 10^{-3}$ Pa or less. An Ar gas was introduced into the chamber, a bias voltage was applied to the base material, and the surface of the base material was cleaned by a glow discharge. Then, an intermediate layer was formed of Cr. Next, the evaporation source of the graphite cathode was discharged to form an amorphous hard carbon film on the surface of the intermediate layer.

In this example, at the time of forming the amorphous hard carbon film, an arc current was made constant and a pulse bias voltage was linearly decreased from 1500 V to 100 V as the film forming time elapsed. Accordingly, the piston ring according to Example 1 having a graded structure in which the $sp^2$ ratio increases from the inner surface side toward the outer surface side was manufactured. Additionally, a relationship between the pulse bias voltage and the $sp^2$ ratio was measured in a separately conducted preliminary test.

Example 2

A piston ring was manufactured similarly to Example 1 except that a film was formed by adjusting a pulse bias voltage in order to obtain a $sp^2$ ratio profile shown in FIG. 3.

Example 3

A piston ring was manufactured similarly to Example 1 except that a film was formed by adjusting a pulse bias voltage in order to obtain a $sp^2$ ratio profile shown in FIG. 4.

Example 4

A piston ring was manufactured similarly to Example 1 except that a film was formed so that a value of B A was smaller than 20% by reducing a change width of a pulse bias voltage.

Comparative Example 1

A piston ring was manufactured similarly to Example 1 except that an amorphous hard carbon film was formed while maintaining a constant bias voltage without continuously changing the bias voltage with the elapse of the film forming time.

The piston rings according to Examples 1 to 4 and Comparative Example 1 were measured and evaluated as below. The result is shown in Table 1.

(1) Evaluation of $Sp^2$ Ratio Profile of Amorphous Hard Carbon Film

The profile of the $sp^2$ ratio of the hard carbon film in the film thickness direction was evaluated as below. That is, the $sp^2$ ratio was measured at the interval of about 2 µm from the inner surface side of the amorphous hard carbon film toward the outer surface side thereof while observing the cross-section of the amorphous hard carbon film using a transmission electron microscope (TEM). The vicinity of the inner surface of Table 1 is a measurement value of the $sp^2$ ratio at a position of about 0.2 µm within the amorphous carbon film from the interface with the intermediate layer. Additionally, when the intermediate layer is not formed, the vicinity of the inner surface may be a measurement value of the $sp^2$ ratio at a position of about 0.2 µm within the amorphous carbon film from the interface with the base material. The vicinity of the outer surface is a measurement value of the $sp^2$ ratio at a position about 0.2 µm within the amorphous carbon film from the surface. The $sp^2$ ratio was calculated on the basis of the spectrum obtained according to electron energy loss spectroscopy (EELS).

The hard carbon layer of the thin sample is observed by TEM-EELS and the obtained observation value is subjected to the correction of the influence of the background signal, and the like. The $sp^2$ ratio is calculated as below by the analysis based on the corrected data.

(1) Based on the energy loss spectrum, data is acquired in an area of 240 eV to 550 eV.

(2) An approximate curve is calculated for data with an energy loss of 320 eV or more.

(3) The observed values are normalized on the basis of the obtained approximate curve.

(4) Peaks are separated by using a Gaussian function in the range of 280 to 295 eV using normalized data, the peak area on the low energy side is obtained, and the value is set as $S\pi$.

(5) In the normalized data, an area of 280 to 310 eV is calculated and is set as $S\pi+\sigma$.

(6) Similarly, diamond and graphite samples are observed in order from (1) to (5) and each of an area of a peak in the vicinity of 285 eV and an area of 280 to 310 eV is calculated. An area obtained for diamond is set as $Sd\pi$ and $Sd(\pi+\sigma)$ and an area for graphite is set as $Sg\pi$ and $Sg(\pi+\sigma)$. Then, the $sp^2$ ratio is calculated by the following equation.

$$sp2(\%) = 1 - \left(\frac{Sg\pi}{Sg(\pi+\sigma)} - \frac{S\pi}{S(\pi+\sigma)}\right) \bigg/ \left(\frac{Sg\pi}{Sg(\pi+\sigma)} - \frac{Sd\pi}{Sd(\pi+\sigma)}\right)$$

(2) Measurement of Hydrogen Content of Amorphous Hard Carbon Film

The hydrogen content of the amorphous hard carbon film was obtained by Rutherford Backscattering Spectroscopy (RBS) and Hydrogen Forward Scattering (HFS). The hydrogen content for the outer surface side of the amorphous hard carbon film was measured. As a measurement device, RBS made by CEA was used and the measurement conditions were set as below.

Incident Ion: 2.275 MeV 4He$^{++}$ (RBS, HFS)
Beam Diameter: 1 to 2 mmϕ
RBS Detection Angle: 160°
Grazing Angle: 110°
HFS Detection Angle: 130°

(3) Thickness Measurement of Amorphous Hard Carbon Film

The thickness of the amorphous hard carbon film was measured by so-called CALOTEST (dimension measurement of polishing marks) according to a spherical polishing method.

Figure 6:
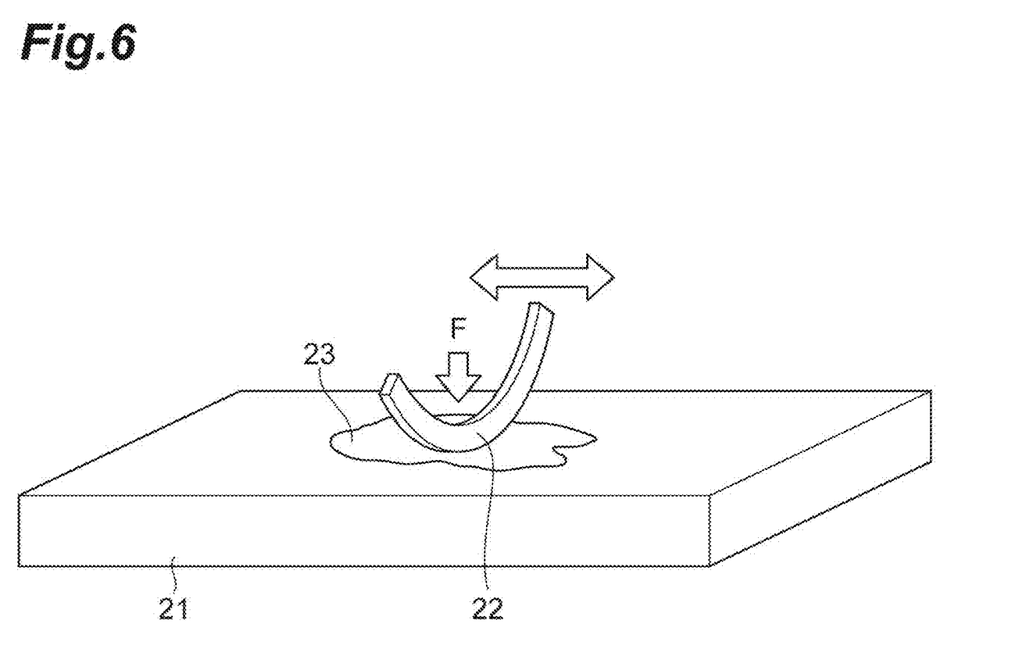
FIG. 6 is a perspective view schematically illustrating a case of performing a method of a reciprocation sliding test.
Figure 7:
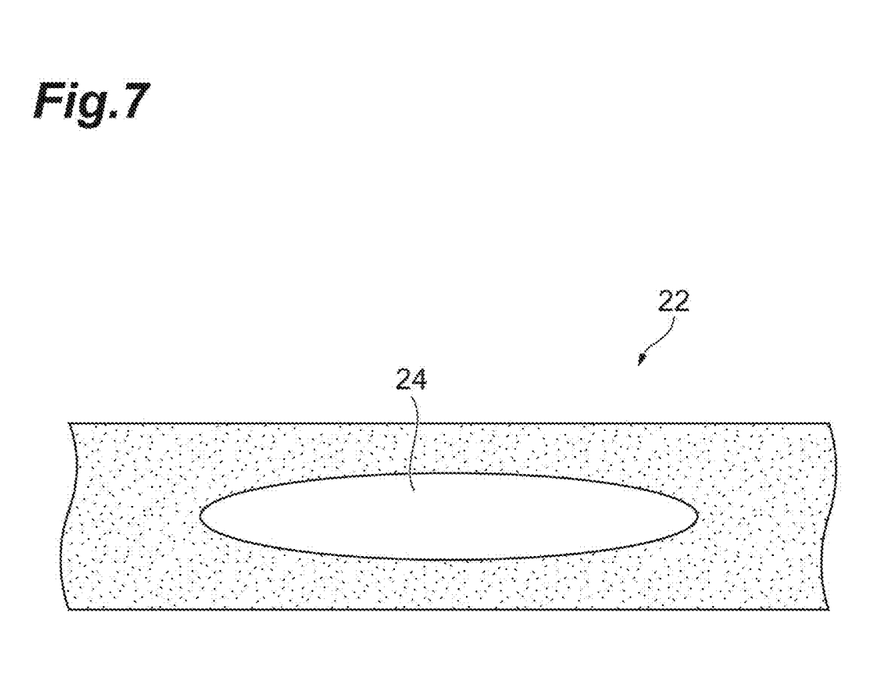
FIG. 7 is a plan view illustrating a surface of a piston ring piece subjected to the reciprocation sliding test.

(4) Evaluation of Peel Resistance and Wear Resistance by Reciprocal Sliding Test The peel resistance was measured by a reciprocation sliding test. As a test device, one having a configuration illustrated in FIG. 6 was used. An FC (cast iron) plate 21 illustrated in FIG. 6 corresponds to a cylinder and a piston ring piece 22 fixed to a jig (not illustrated) moves in a reciprocating manner on the FC plate 21 in the thickness direction of the piston ring piece 22 (the left and right direction of FIG. 6) under the presence of the lubricant 23. Additionally, as the FC plate 21, one having surface roughness R$_{zjis}$, adjusted to 1.1 μm by polishing process was used. The piston ring piece 22 was prepared by cutting the piston ring into a length of about 30 mm. The test conditions were set such that a vertical load (F) was 500 N, 600 N, 700 N, 800 N, or 900 N, a stroke was 3 mm, a speed was 3000 rpm, a plate temperature was 120° C., a lubrication was performed by dropping 3 drops of engine oil 0W-20, and a test time was 30 minutes. The evaluation of the peel resistance of the amorphous hard carbon film was performed by visually observing the presence of the peeling in the periphery of the oval sliding portion 24 generated in the piston ring piece 22 after the test illustrated in FIG. 7. Further, the evaluation of the wear resistance was performed on the basis of the amount of wear of Example 1 (vertical load: 500 N).

TABLE 1

| | | | Example 1 | Example 2 | Example 3 | Example 4 | Comparative Example 1 |
|---|---|---|---|---|---|---|---|
| sp$^2$ Ratio (%) | Vicinity of inner surface A | | 24 | 45 | 23 | 21 | 45 |
| | Distance from inner surface | 1.0 μm | 27 | 47 | 24 | 24 | 45 |
| | | 3.0 μm | 40 | 55 | 28 | 28 | 47 |
| | | 5.0 μm | 51 | 60 | 32 | 31 | 45 |
| | | 7.0 μm | 59 | 62 | 40 | 34 | 45 |
| | | 9.0 μm | 73 | 65 | 50 | 38 | 46 |
| | Vicinity of outer surface B | | 78 | 66 | 55 | 39 | 46 |
| B-A | | | 54 | 21 | 32 | 18 | 2 |
| Hydrogen content (atomic %) | | | 1.2 | 2.4 | 0.8 | 3.2 | 1.0 |
| Thickness of amorphous hard carbon film (μm) | | | 9.8 | 9.7 | 9.8 | 9.9 | 11.8 |
| Presence of peeling | Vertical load | 500 N | No | No | No | No | No |
| | | 600 N | No | No | No | No | No |

TABLE 1-continued

| | | Example 1 | Example 2 | Example 3 | Example 4 | Comparative Example 1 |
|---|---|---|---|---|---|---|
| peeling | 700 N | No | No | No | Yes | Yes |
| | 800 N | No | Yes | No | Yes | Yes |
| | 900 N | No | Yes | Yes | Yes | Yes |
| Wear amount ratio (Based on vertical load of 500 N of Example 1) | | 1 | 0.9 | 0.8 | 1.5 | 2.1 |

INDUSTRIAL APPLICABILITY

According to the disclosure, a sliding member and a piston ring capable of sufficiently suppressing an amorphous hard carbon film from being peeled off from a base material and having sufficiently high wear resistance are provided.

REFERENCE SIGNS LIST

1: base material, 3: amorphous hard carbon film, 5: intermediate layer, 10: sliding member (piston ring), 21: FC (cast iron) plate, 22: piston ring piece, 23: lubricant, 24: sliding portion, F1: inner surface of amorphous hard carbon film, F2: outer surface of amorphous hard carbon film.

The invention claimed is:

1. A sliding member comprising:
a base material; and
an amorphous hard carbon film formed on a surface of the base material,
wherein the amorphous hard carbon film has a graded structure in which a sp$^2$ ratio increases from an inner surface side adjacent to the base material toward an outer surface side, and
wherein when a sp$^2$ ratio of the inner surface side of the amorphous hard carbon film is indicated by A % and a sp$^2$ ratio of the outer surface side of the amorphous hard carbon film is indicated by B %, a value of (B−A) is 20 or more.

2. The sliding member according to claim 1, wherein the sp$^2$ ratio of the inner surface side of the amorphous hard carbon film is smaller than 40%, and the sp$^2$ ratio of the outer surface side of the amorphous hard carbon film is larger than 65%.

3. The sliding member according to claim 1, wherein a hydrogen content of the amorphous hard carbon film is smaller than 5 atomic %.

4. The sliding member according to claim 1, wherein a thickness of the amorphous hard carbon film is 3 μm to 40 μm.

5. The sliding member according to claim 1, wherein a density of droplets of 300 μm$^2$ or more in size existing on a surface of the amorphous hard carbon film is 600 pieces/mm$^2$ or less.

6. The sliding member according to claim 1, wherein the base material is formed of a steel material having a thermal conductivity of 30 W/(m·K) or more.

7. The sliding member according to claim 1, further comprising an intermediate layer provided between the base material and the amorphous hard carbon film.

8. A piston ring comprising the sliding member according to claim 1.

9. The sliding member according to claim 2, wherein a hydrogen content of the amorphous hard carbon film is smaller than 5 atomic %.

10. The sliding member according to claim 9, wherein a thickness of the amorphous hard carbon film is 3 µm to 40 µm.

11. The sliding member according to claim 10, wherein a density of droplets of 300 µm$^2$ or more in size existing on a surface of the amorphous hard carbon film is 600 pieces/mm$^2$ or less.

12. The sliding member according to claim 11, wherein the base material is formed of a steel material having a thermal conductivity of 30 W/(m·K) or more.

13. The sliding member according to claim 12, further comprising an intermediate layer provided between the base material and the amorphous hard carbon film.

14. The sliding member according to claim 3, wherein a thickness of the amorphous hard carbon film is 3 µm to 40 µm.

15. The sliding member according to claim 14, wherein the base material is formed of a steel material having a thermal conductivity of 30 W/(m·K) or more.

16. The sliding member according to claim 15, further comprising an intermediate layer provided between the base material and the amorphous hard carbon film.

17. The sliding member according to claim 2, wherein a density of droplets of 300 µm$^2$ or more in size existing on a surface of the amorphous hard carbon film is 600 pieces/mm$^2$ or less.

18. The sliding member according to claim 2, wherein the base material is formed of a steel material having a thermal conductivity of 30 W/(m·K) or more.

19. The sliding member according to claim 18, further comprising an intermediate layer provided between the base material and the amorphous hard carbon film.

20. The sliding member according to claim 2, further comprising an intermediate layer provided between the base material and the amorphous hard carbon film.

* * * * *